(12) United States Patent
Maaninen et al.

(10) Patent No.: US 11,759,782 B2
(45) Date of Patent: Sep. 19, 2023

(54) MICROFLUIDIC CHIP AND A METHOD FOR THE MANUFACTURE OF A MICROFLUIDIC CHIP

(71) Applicant: Teknologian tutkimuskeskus VTT Oy, Espoo (FI)

(72) Inventors: Tiina Maaninen, VTT (FI); Annukka Kokkonen, VTT (FI); Marika Kurkinen, VTT (FI); Sanna Aikio, VTT (FI)

(73) Assignee: Teknologian tutkimuskeskus VTT Oy, Espoo (FI)

( * ) Notice: Subject to any disclaimer, the term of this patent is extended or adjusted under 35 U.S.C. 154(b) by 710 days.

(21) Appl. No.: 16/627,373

(22) PCT Filed: Jun. 25, 2018

(86) PCT No.: PCT/FI2018/050492
§ 371 (c)(1),
(2) Date: Dec. 30, 2019

(87) PCT Pub. No.: WO2019/002678
PCT Pub. Date: Jan. 3, 2019

(65) Prior Publication Data
US 2021/0146357 A1   May 20, 2021

(30) Foreign Application Priority Data

Jun. 30, 2017  (FI) ...................... 20175637

(51) Int. Cl.
*B01L 3/00* (2006.01)
*B81B 1/00* (2006.01)
*B81C 1/00* (2006.01)

(52) U.S. Cl.
CPC ... *B01L 3/502746* (2013.01); *B01L 3/502707* (2013.01); *B81B 1/006* (2013.01);
(Continued)

(58) Field of Classification Search
CPC ............. B01L 3/5027; B01L 3/502746; B01L 3/502707; B01L 2200/0605;
(Continued)

(56) References Cited

U.S. PATENT DOCUMENTS

| | | | |
|---|---|---|---|
| 4,859,421 A | 8/1989 | Apicella | |
| 6,911,183 B1 | 6/2005 | Handique et al. | |

(Continued)

FOREIGN PATENT DOCUMENTS

| | | |
|---|---|---|
| CN | 101687364 A | 3/2010 |
| CN | 103282123 A | 9/2013 |

(Continued)

OTHER PUBLICATIONS

Feyssa et al: Patterned Immobilization of Antibodies within Roll-to-Roll Hot Embossed Polymeric Microfluidic Channels. PLOS One, Jul. 18, 2013. vol. 8, No. 7, e68918, pp. 1-11.

(Continued)

*Primary Examiner* — Brian J. Sines
(74) *Attorney, Agent, or Firm* — Laine IP Oy

(57) ABSTRACT

A novel microfluidic chip is proposed for performing a chemical or biochemical test in a metered reaction volume. The microfluidic chip has a body which defines an inner flow volume. An inlet has been provided to the body for connecting the inner flow volume to the ambient space. A waste channel forms part of the inner flow volume and is in fluid communication with the inlet. A sample channel also forms part of the inner flow volume and is in fluid communication with the inlet. The sample channel includes a first hydrophobic stop and a second hydrophobic stop at a distance from the first hydrophobic stop so as to provide a metered reaction volume there between. An expelling channel is in fluid communication with the metered reaction volume of the sample channel through the first hydrophobic stop. A (Continued)

sample reservoir is in fluid communication with the metered reaction volume of the sample channel through the second hydrophobic stop.

15 Claims, 2 Drawing Sheets

(52) U.S. Cl.
CPC ... *B81C 1/00119* (2013.01); *B01L 2200/0605* (2013.01); *B01L 2200/12* (2013.01); *B01L 2300/069* (2013.01); *B01L 2300/0864* (2013.01); *B01L 2300/0887* (2013.01); *B01L 2300/123* (2013.01); *B01L 2300/165* (2013.01); *B01L 2400/0406* (2013.01); *B01L 2400/0481* (2013.01); *B01L 2400/0688* (2013.01); *B81B 2201/05* (2013.01); *B81B 2203/0338* (2013.01); *B81C 2201/015* (2013.01); *B81C 2203/03* (2013.01)

(58) Field of Classification Search
CPC ....... B01L 2400/0688; B01L 2300/165; B81B 2201/05; B81B 2203/0338; B81C 1/00119
See application file for complete search history.

(56) References Cited

U.S. PATENT DOCUMENTS

| | | |
|---|---|---|
| 2004/0209381 A1 | 10/2004 | Peters et al. |
| 2010/0143194 A1 | 6/2010 | Lee et al. |
| 2011/0008210 A1 | 1/2011 | Kurkinen et al. |
| 2012/0196280 A1 | 8/2012 | Karlsen et al. |
| 2013/0309778 A1* | 11/2013 | Lowe ................ B01L 3/502715 422/69 |
| 2014/0014192 A1 | 1/2014 | Ussing |
| 2015/0024477 A1 | 1/2015 | Mori et al. |
| 2015/0093838 A1 | 4/2015 | Landers et al. |
| 2015/0147777 A1 | 5/2015 | Dothie |
| 2016/0167042 A1 | 6/2016 | Tyrrell et al. |

FOREIGN PATENT DOCUMENTS

| | | |
|---|---|---|
| CN | 104066849 A | 9/2014 |
| EP | 0293519 A1 | 12/1988 |
| EP | 2658653 B1 | 3/2015 |
| EP | 2875866 A1 | 5/2015 |
| EP | 2363207 B1 | 10/2016 |
| WO | WO9919717 A1 | 1/2011 |
| WO | WO2011108333 A1 | 9/2011 |
| WO | WO2016069091 A1 | 5/2016 |

OTHER PUBLICATIONS

Hakalahti et al: Your lab on a chip—Roll-to-roll hotembossed microfluidics for life sciences applications. Freedom of Design. Research, Development and Commerc. Highlights in Printed Intellig. 2011-2012, 2012. pp. 32-34.

Iwai et al: Finger-powered microfluidic systems using multilayer soft lithography and injection molding processes. Lab on Chip, 2014. vol. 14, No. 19, pp. 3790-3799.

Kang et al: Portable multi-immunosensing lab-on-a-chip (LOC) triggered by air bladder. BioMEMS and Nanotechnology III Confrence, Dec. 27, 2007.

* cited by examiner

MICROFLUIDIC CHIP AND A METHOD FOR THE MANUFACTURE OF A MICROFLUIDIC CHIP

FIELD

The present disclosure relates to devices for optical analysis. In particular, the disclosure relates to devices for receiving a liquid sample for optical analysis. More specifically, the disclosure relates to a microfluidic chip and a method for the manufacture of a microfluidic chip.

BACKGROUND

Microfluidic chips are widely used to facilitate a host of different analysis methods performed on liquid samples. While there are very sophisticated devices designed for laboratory environment, there is a growing need for basic analysis devices for patients to use themselves outside a treatment facility. To avoid the need to administer a specific amount of sample fluid into the analysis device with a precision tool, such as a pipette, the most preferred devices designed for domestic use are equipped with a metered sample volume to allow for overflow of the sample liquid without jeopardizing the analysis. EP 2875866 A1, for example, discloses a fluidic device including an overspill chamber for collecting the excess sample.

There remains, however, a need to simplify such microfluidic devices to be viable for mass production and domestic use.

SUMMARY OF THE INVENTION

A novel microfluidic chip is therefore proposed for performing a chemical or biochemical test in a metered reaction volume. The microfluidic chip has a body which defines an inner flow volume. An inlet has been provided to the body for connecting the inner flow volume to the ambient space. A waste channel forms part of the inner flow volume and is in fluid communication with the inlet. A sample channel also forms part of the inner flow volume and is in fluid communication with the inlet. The sample channel includes a first hydrophobic stop and a second hydrophobic stop at a distance from the first hydrophobic stop so as to provide a metered reaction volume there between. An expelling channel is in fluid communication with the metered reaction volume of the sample channel through the first hydrophobic stop. A sample reservoir is in fluid communication with the metered reaction volume of the sample channel through the second hydrophobic stop.

A method is also proposed for the manufacture of such a microfluidic chip. In the novel method at least two substrates are provided, wherein the substrates are flexible enough to enable continuous roll-to-roll, stop-and-go roll, or sheet manufacturing. An inner flow channel is formed to one or more of the at least two substrates. A passage is formed to one or more of the at least two substrates so as to provide an inlet to the inner flow channel. Two hydrophobic stops are provided to the inner flow channel at a distance from one another so as to provide a metered reaction volume there between. A capture antibody is provided to the reaction volume for establishing a reaction zone. The substrates are superposed on each other and laminating together to form the microfluidic chip by roll-to-roll, stop-and-go roll, or sheet manufacturing.

More specifically, the invention is defined by the features of the independent claims. Some specific embodiments are defined in the dependent claims.

Considerable benefits are gained by virtue of the novel proposition. Because the inner flow channel is arranged in a particular way, two-dimensional fluid flow is enough to facilitate the pursued optical analysis. Accordingly, there is no need for magnetic or otherwise complex actuators to meter the desired sample volume for analysis. On the other hand the two-dimensional fluid flow enables advantageous manufacturing techniques to mass produce the device for domestic use. Further benefits gained with particulars of specific embodiments are discussed here after.

BRIEF DESCRIPTION OF THE DRAWINGS

In the following certain embodiments will be discussed in greater detail with reference to the accompanying drawings, in which.

EMBODIMENTS

Figure 1:
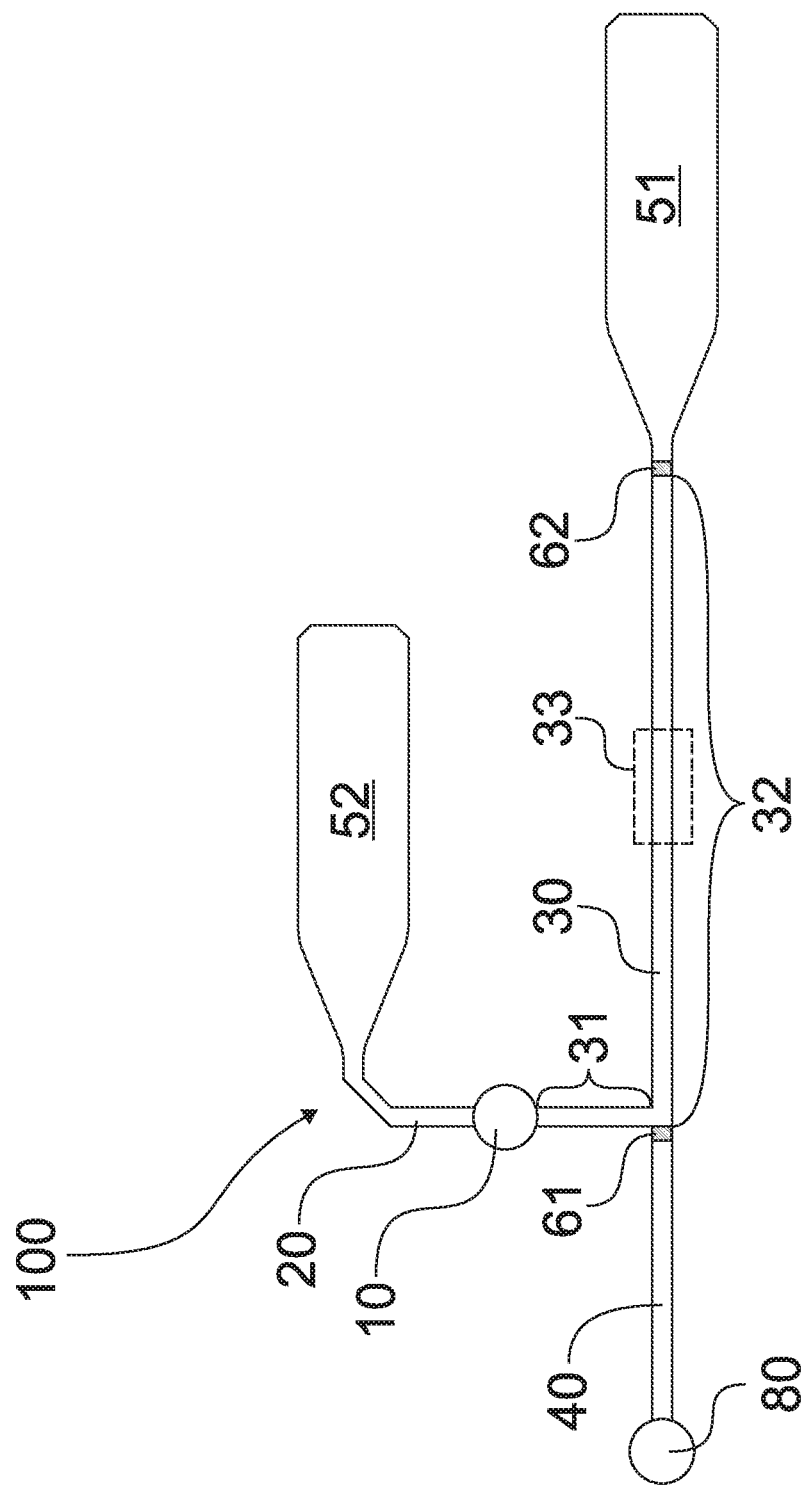
FIG. 1 illustrates a schematic top view of a microfluidic chip in accordance with at least some embodiments of the present invention.

A novel microfluidic chip 100 having an inner flow volume made by a network of channels 20, 30, 40, 51, 52 is constructed into a body 200 with an optionally at least partly transparent top plate to facilitate optical analysis. The components of the inner flow volume are in fluid connection with each other, i.e. the components are connected to each other so as to allow the passage of fluid from one another. That said, liquid flow is restricted to certain parts of the inner flow volume, namely the expelling channel 40 and sample reservoir 51, by means of hydrophobic stops while gas flow remains free.

Figure 2:
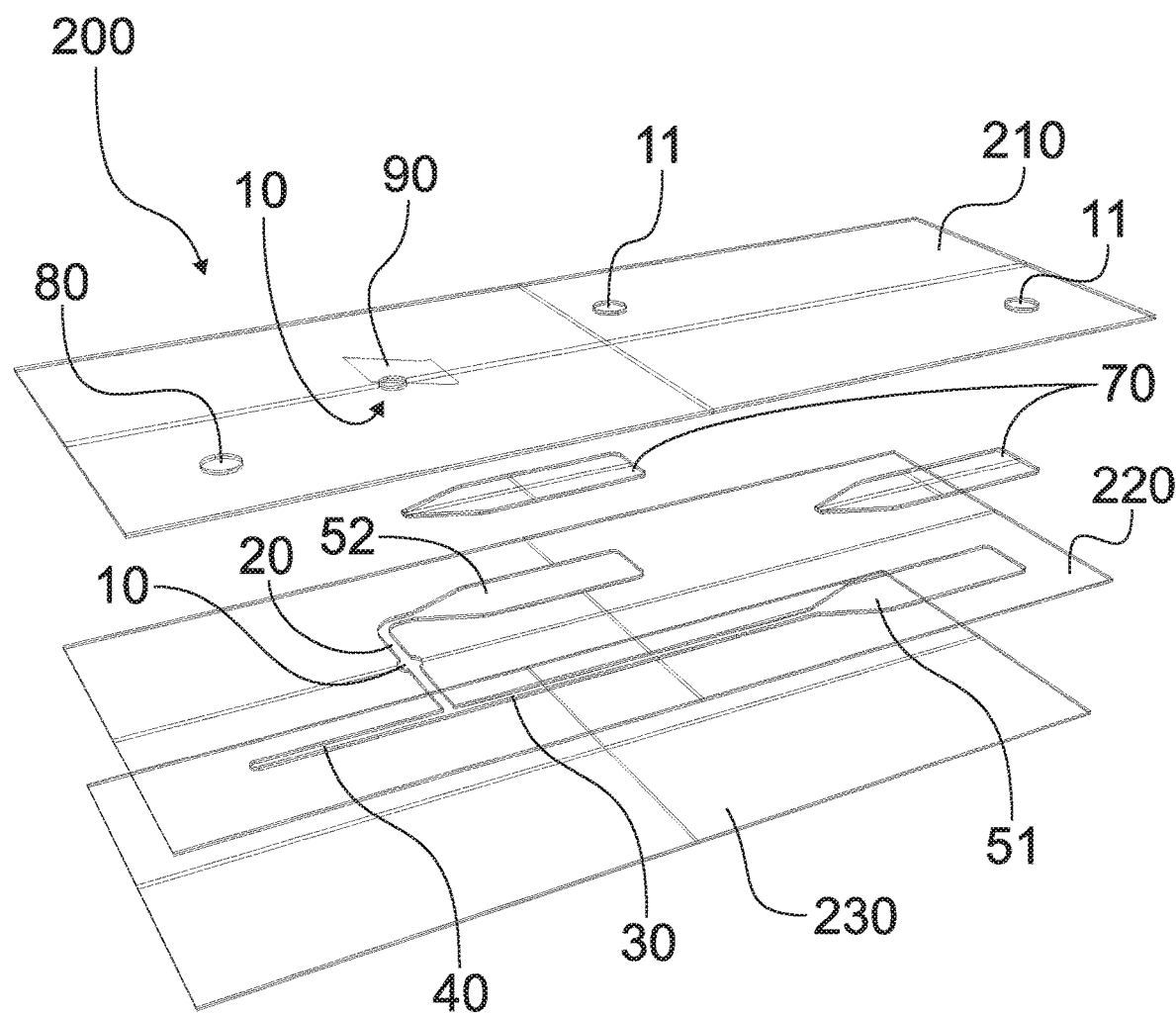
FIG. 2 illustrates a perspective exploded view of the microfluidic chip of FIG. 1.

Turning first to FIG. 2 which illustrates one example of constructing a microfluidic chip. In this context the expression microfluidic refers to the microliter scale of the device. In other words, the volume of the inner flow volume is in the approximate range of 1 to 510 microliters. In the illustrated example the microfluidic chip is formed by a body 200, which has several layers. Firstly there is a bottom substrate 230, which may be formed of a polymer, such as PPP or PMA, glass, metal, optionally elastically deformable metal, paper, optionally coated paper, or any hydrophilic material. The bottom substrate 230 is optionally solid over the sections of the body 200 that contain channels to limit the flow to a two-dimensional domain. An intermediate substrate 220 is placed on top of the bottom substrate 230. The intermediate substrate 220 defines the shape and extent of the inner flow volume of the microfluidic chip. The sections of the inner flow volume are discussed in greater detail here after. The intermediate substrate 220 includes openings extending through the thickness of the intermediate substrate 220 to form the inner flow volume. Superposed on the intermediate or bottom substrate is a top substrate 210. To facilitate optical tests, the top substrate 210 is optionally transparent for wavelengths used in optical testing. Typical wavelengths used in optical tests range from ultraviolet to infrared range including the visible range. According to a particularly advantageous embodiment, the top substrate 210 is see-through. The top substrate 210 includes an opening for acting as an inlet 10 for introducing fluid into the inner flow volume which is formed into the space between the top and bottom substrates 210, 230 and defined by the intermediate substrate 220.

Alternatively, the inner flow volume could be produced to the bottom or top substrate as well by removing material or by casting the block forming the bottom or top substrate (not shown). Also, the inlet could be made to the bottom substrate.

The body 200 may be made of three layers as shown in FIG. 2. The body 200 may alternatively be formed of two layers or more than three layers (not shown). When using an elastically deformable material, the body 200 may be made flexible to enable continuous roll to roll or stop-and-go roll. Also sheet manufacturing process may be applied. In the present context, flexible may be seen as the ability to experience elastic deformation to a bending radius of 300 mm, particularly 200 mm, at 20 degrees Celcius. Such a construction enables manufacturing by means of a continuous or stop-and-go roll or sheet process which may include hot-embossing, diecutting, laser cutting, hybrid assembly, screen printing, gravure printing, flexo printing, inkjet printing, slot die coating, reverse gravure printing, uv-curing, laser ablation, nano-imprinting and lamination. Any combination of such go roll or sheet processes will lead to an effective manufacturing process for mass production.

According to a particular embodiment, the manufacturing process makes device is made by laminating. To facilitate the lamination stage, the bottom, intermediate and top substrates 230, 220, 210 are prepared in any order or simultaneously. The bottom substrate 230 may be prepared by producing the hydrophobic stops to the bottom substrate 230 with screen printing, die cut or slot die coating, gravure coating, reverse gravure coating, inkjet printing, flexo printing, uv-curing, nano-imprinting, or any suitable method. The intermediate substrate 220 may be prepared by providing suitable channels by die cutting. The sample reservoir 51 and/or the waste reservoir 52 may be produced with a similar method at this stage or later. The intermediate substrate 220 is laminated to the top substrate 210 to create a top sub-assembly 210, 220. With the top sub-assembly 210, 220 in place, the opening forming the inlet 10 is formed to the top substrate 210 and intermediate substrate 220 by laser or die cutting. The capture antibodies needed in the optical analysis performed with the device may be provided at this or an earlier stage. The capture antibodies may be dispensed with a dispenser, inkjet printer, or a similar device. The capture antibodies may be dispensed over the entire sample channel 30 or only to a limited detection zone 33 of the sample channel 30. If absorption material is used, the material may be installed at this stage. Finally, the bottom substrate 230 is laminated to the top sub-assembly 210, 220.

The manufacturing process described above for a three layer construction may be modified for a two layer construction including a bottom and a top substrate without an intermediate layer there between (not shown). The flow channel may be formed to any substrate or substrates in the device by shaping the interface surface of the substrates. When producing the flow channel to a body comprising only two substrates, the flow channel forming recess may be provided to the top or bottom substrate or both. The flow channel may be produced by removing material by laser cutting or laser ablation or the channel may be molded by hot embossing or nano-imprinting, for example. The hydrophobic stops may be produced as above. Accordingly, the top substrate is laminated directly on top of the bottom substrate, wherein the inner channel is formed there between.

According to yet another embodiment, the body comprises three layers as shown in FIG. 2, but instead of forming the flow channel by the cavities in the intermediate layer alone, also the top or bottom substrate or both comprise recessed areas which participate in forming the inner flow volume.

Turning now to FIG. 1 which reveals the shape and functions of the inner flow volume more clearly. As said above, the inlet 10 formed to the top substrate 210 connects the inner flow volume of the body 200 to the outside space. The inner flow volume is designed to create a network permitting free air flow within the network. Connected to the inlet 10 is a sample channel 30 encased by the body 200. When viewed in a cross-section view (not shown), the sample channel 30 is located at the bottom of the inlet 10. When liquid is entered into the inlet 10, the mass of the liquid in the relatively large inlet 10 urges liquid down the sample channel 30, which movement is further advanced by capillary action. Accordingly, the inlet 10 and sample channel 30 are dimensioned to facilitate such action.

According to one embodiment, the inlet 10 may be equipped with a seal 90 (FIG. 2). The seal 90 may be completely detached and configured to be attached to the body 200 or the seal 90 may be attached to the body 200 so as to be manipulated to seal or open the inlet 10. More specifically the seal 90 may be toggled between an open state, in which the seal 90 permits a flowing passage of fluid into the inner flow volume, and a closed state, in which the seal 90 prevents a flowing passage of fluid into the inner flow volume. A simple example of such a seal 90 would be a piece of adhesive tape which may be unfolded from an open state adjacent to the inlet 10 into a closed state covering the inlet 10. Another simple example would be a cork.

In the illustrated example the sample channel 30 has a first section 31 extending from the inlet 10 to one direction and a second section 32 extending from the first section to a different direction, particularly to an orthogonal direction. In other words, the sample channel 30 exhibits a corner between two sections 31, 32.

The sample channel 30 has been provided with two hydrophobic stops 61, 62. More specifically, a first hydrophobic stop 61 has been positioned at a distance from a second hydrophobic stop 62, whereby a metered reaction volume is created to a section extending between the hydrophobic stops 61, 62. The volume of the metered reaction volume is defined by the distance between the hydrophobic stops 61, 62, the thickness of the intermediate substrate 220 and the breadth of the sample channel 30. In the shown example, the second section 32 of the sample channel 30 forms the metered reaction volume. There are several different options to form the hydrophobic stops 61, 62. The stop may be achieved by increasing the topography, i.e. surface roughness, or surface energy of the channel at the appropriate locations. One way is to print a hydrophobic substance, such as carbon ink, UV curable acrylate ink, wax, micro structures, nano structures, and the like, onto the bottom substrate 230. Another way would be to apply a Teflon® or other hydrophobic coating onto the surface of the sample channel 30 over a small section at an appropriate location. Yet another way would be grind the surface of the sample channel 30 with an abrasive material so as to increase the surface roughness and to establish a hydrophobic stop. Regardless of the method of producing the hydrophobic stop the hydrophobic stop may be able to prevent a sample fluid at atmospheric pressure from flowing past the first and second hydrophobic stops 61, 62 by capillary action alone. Particularly, difference in surface energy of the inner flow channel at the hydrophobic stop 61, 62 and the rest of the inner flow channel is 10 mN/m or more, more particularly 20 mN/m or more.

In the sample channel 30, particularly in the second section 32 between the hydrophobic stops 61, 62 has been provided a detection zone 33. The detection zone 33 is a portion of the inner flow channel to which the analytes are collected and where the measurement signal is detected. The detection zone 33 may take any shape, such as a quadrilateral shape shown in FIG. 1, and may be for example a couple of millimetres per side to avoid the need for microscopic magnification. The detection zone 33 comprises a capture antibody or several capture antibodies dispensed on flow surface the sample channel 30. The sample channel 30, particularly the second portion 32 thereof i.e. the reaction volume may be provided with a fluorescence substance to enable competitive or non-competitive immunoassay.

Connected to the sample channel 30, particularly to the second section 32, more particularly to the second end of the second section 32 of the sample channel 30, is a sample reservoir 51. The sample reservoir 51 may be encased by the body 200 as shown in the FIGURES or it may be arranged outside the body as an external reservoir (not shown). The sample reservoir 51 is connected to the sample channel 30 through the second hydrophobic stop 62. The sample reservoir 51 is set to receive liquid expelled from the sample channel 30. Accordingly, the sample reservoir 51 is dimensioned to receive and hold the volume of liquid held by the sample channel 30. In other words, the volume of the sample reservoir 51 is equal to or larger than that of the sample channel 30. The sample reservoir 51 may contain an absorbent material, such as paper, fabric, silica, etc., or a capillary pump to further attract the liquid. The sample reservoir 51 is in fluidic connection to the ambient space through an air outlet 11 for exhausting air trapped in the inner flow volume, when liquid is being pushed along the channel 30. The air outlet 11 may be a simple hole or a valved passage provided to the top substrate 210 or bottom substrate 230 or both.

Connected to the sample channel 30, particularly to the second section 32, more particularly to the first end of the second section 32 of the sample channel 30, is an expelling channel 40. The expelling channel 40 is encased by the body 200. The expelling channel 40 is connected to the sample channel 30 through the first hydrophobic stop 61. The purpose of the expelling channel 40 is to act as a port for pressurizing the liquid contained in the metered reaction volume 32 in the sample channel 30. The first hydrophobic stop 61 separates the sample channel 30 from the expelling channel 40 so as to prevent liquid from entering the expelling channel 40. In the layout of FIG. 1 the second section 32 of the sample channel 30 and the expelling channel 40 are aligned, whereas the first section 31 of the sample channel 30 extends from the second section 32 in an angle. The first hydrophobic stop 61 is placed to connect the expelling channel 40 to the sample channel 30 at the junction of the first and second sections 31, 32 of the sample channel 30. In other words, the first hydrophobic stop 61 is placed to allow capillary flow between the first and second section 31, 32 of the sample channel 30 but to prevent capillary flow between the sample channel 30 and the expelling channel 40.

Connected to the expelling channel 40 is a pneumatic source 80. In the illustrated example the pneumatic source 80 is connected to the end of the expelling channel 40 opposing the first hydrophobic stop 61. The pneumatic source 80 may simply be a blister pump or similar manual device for increasing the pressure inside the expelling channel 40. The blister pump may be constructed by providing the top substrate 210 with a through hole connecting the expelling channel 40 to the ambient space. The top part of the through hole may be provided with a supple membrane which acts as a diaphragm or blister pump. The membrane may extend over the opening in the top substrate 210 so as to increase the volume defined by the membrane. Indeed, the volume defined by the membrane is dimensioned to be enough to increase the pressure inside the expelling channel 40 to urge liquid contained in the metered sample volume 32 past the second hydrophobic stop 62. Alternatively the pneumatic source 80 may be simple port for introducing pressurised air into the inner flow channel. Accordingly, the pneumatic source 80 may take the shape of a pneumatic connector for coupling thereon a compressor tube, bellows, or similar.

Connected also to the inlet 10 is a waste channel 20 which is formed into the body 200. The waste channel 20 leads from the inlet towards a waste reservoir 52 which is constructed to receive and hold liquid. The waste reservoir 52 optionally includes an absorbent material, a capillary pump or another means of attracting liquid entering into the inner flow volume through the inlet 10. The waste reservoir 52 is designed to receive and hold a substantial volume of fluid. The waste reservoir 52 may include absorption material 70 or a capillary pump to further attract the liquid. The waste reservoir 52 is in fluidic connection to the ambient space through an air outlet 11 for exhausting air trapped in the inner flow volume, when liquid is being pushed along the channel 30. The air outlet 11 may be a simple hole or a valved passage provided to the top substrate 210 or bottom substrate 230 or both.

The above example could be varied by offsetting the junction between the sample channel 30 and expelling channel 40 slightly. In other words, the channels need not be exactly aligned. The alignment shown in the FIGS. 1 and 2 is, however, selected for accuracy.

The use of the device is simple. First, the sample liquid is administered into the inlet 10 by a pipette or by pouring from a vessel. For domestic use it may be advantageous to use a funnel of some sort to improve accuracy. The mass of the sample liquid accumulated into the volume of the inlet 10 combined with the appropriately selected dimensions for the inner flow channel urges the sample liquid onward in the inner flow channel. The inner flow channel is optionally two-dimensional, whereby the liquid flow need not exceed resistance caused by elevations. Furthermore, a device featuring only a two-dimensional inner flow channel may be produced by a roll-to-roll manufacturing method which is very beneficial for mass production. On the one hand, a stream of liquid flow proceeds down the sample channel 30. The sample liquid first travels across the first section 31 of the sample channel 30, wherein the first hydrophobic stop 61 prevents the liquid from entering the expelling channel 40. The liquid proceeds across the second section 32 of the sample channel 30 until it is stopped by the second hydrophobic stop 62. On the one hand, a stream of liquid flow proceeds up the waste channel 20 spurred by capillary action and potentially the absorbent material housed in the waste reservoir 52. On the other hand the absorbent material has the added benefit that the liquid is not returned to the channel. The absorbent material also limits the speed in which the liquid is moved in the inner flow channel. This yields the benefit of controlling the reaction time. Once the metered sample volume, i.e. the second section 32, of the sample channel is full or about to become full, the supply of sample liquid is ended. The stream in the waste channel 20 may continue for a while as the liquid makes its way to the waste reservoir 52 until the inlet 10 is empty.

Now the sample channel 30 is filled with the sample liquid, the inlet 10 is empty or substantially empty, the waste channel 20 is filled and the waste reservoir 52 is at least partly filled. Next, the inlet 10 is sealed by applying tape, inserting a cork or otherwise. The sealing of the inlet 10 may be air tight. With the inlet 10 sealed the sample liquid in the metered sample volume 32 is expelled into the sample reservoir 51. The pneumatic source 80 is operated to pressurize the expelling channel 40. In case a blister pump is employed, a simple depression of the membrane is enough to create the impulse needed to start the liquid flow in the inner flow channel. The elevated pressure in the expelling channel 40 is transmitted to the sample channel 30, whereby the liquid therein is pressurized as well so as to exceed the flow threshold of the second hydrophobic stop 62. It is to be noted that the hydrophobic stops do not arrest air flow to a considerable degree. Once the flow threshold of the second hydrophobic stop 62 has been exceeded, the liquid in the metered sample volume 32 will flow into the sample reservoir 51 potentially encouraged by the therein contained absorption material 70 or capillary pump. The liquid contained in the first section 31 of the sample channel 30 may proceed into the waste reservoir 52 through the closed inlet 10 and the waste channel 20 or be drawn into the sample reservoir 51 depending on the flow resistance created by the inlet 10. If the seal closes the communication between the sample channel 30 and the waste channel 20, the latter option will apply.

The above process will have resulted in the sample to have been flowed past the detection zone 33 in the reaction volume 32, wherein the sample interacted with the capture antibodies. With the metered reaction volume 32 emptied, the microfluidic chip 100 is ready for optical analysis for the residual sample portion remaining in the detection zone 33. The optical analysis, particularly immune/sandwich assay may be, for example, a fluorescence or colorimetric test which analyses residual substances in the metered sample volume 32.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The verbs "to comprise" and "to include" are used in this document as open limitations that neither exclude nor require the existence of also un-recited features. The features recited in depending claims are mutually freely combinable unless otherwise explicitly stated. Furthermore, it is to be understood that the use of "a" or "an", i.e. a singular form, throughout this document does not exclude a plurality.

| REFERENCE SIGNS LIST | |
|---|---|
| 10 | inlet |
| 11 | air outlet |
| 20 | waste channel |
| 30 | sample channel |
| 31 | first section |
| 32 | second section; reaction volume |
| 33 | detection zone |
| 40 | expelling channel |
| 51 | sample reservoir |
| 52 | waste reservoir |
| 61 | first hydrophobic stop |
| 62 | second hydrophobic stop |
| 70 | absorption material |
| 80 | pneumatic source |
| 90 | seal |
| 100 | microfluidic chip |
| 200 | body |
| 210 | top substrate |
| 220 | intermediate substrate |
| 230 | bottom substrate |

CITATION LIST

EP 2875866 A1

The invention claimed is:
1. A microfluidic chip for performing a chemical or biochemical test in a metered reaction volume, the microfluidic chip comprising:
a body defining an inner flow volume,
an inlet provided to the body for connecting the inner flow volume to an ambient space, and a sample channel forming part of the inner flow volume and being connected to the inlet for the passage of fluid between the inlet and the sample channel, wherein, the microfluidic chip comprises a waste channel forming part of the inner flow volume and being connected to the inlet for the passage of fluid between the inlet and the waste channel, the sample channel comprises a first hydrophobic stop and a second hydrophobic stop at a distance from the first hydrophobic stop so as to provide a metered reaction volume there between, the microfluidic chip comprises an expelling channel connected to the metered reaction volume of the sample channel through the first hydrophobic stop for the passage of fluid between the expelling channel and the reaction volume, the microfluidic chip comprises a sample reservoir connected to the metered reaction volume of the sample channel through the second hydrophobic stop for the passage of fluid between the reaction volume and the sample reservoir, and the microfluidic chip comprises a pneumatic source in fluidic connection with the expelling channel, which pneumatic source is configured to introduce pressurized air into the inner flow volume so as to urge fluid in the metered reaction volume past the second hydrophobic stop.

2. The microfluidic chip according to claim 1, wherein the pneumatic source is a manual pressurizer configured to provide elevated pressure to the expelling channel to flush a sample fluid in the metered reaction volume to the sample reservoir.

3. The microfluidic chip according to claim 1, wherein the pneumatic source is a blister pump.

4. The microfluidic chip according to claim 1, wherein the sample channel, the waste channel, the expelling channel, and the sample reservoir are encased into the body.

5. The microfluidic chip according to claim 1, wherein the body has a layered structure comprising:

a top substrate, and
a bottom substrate, wherein the inner flow volume is formed by at least one void in the top substrate or the bottom substrate or both.

6. The microfluidic chip according to claim 1, wherein the body has a layered structure comprising:

a top substrate,
a bottom substrate, and
an intermediate substrate between the top substrate and the bottom substrate, wherein the inner flow volume is formed by at least one void in the intermediate substrate.

7. The microfluidic chip according to claim 5, wherein the inlet is a through hole in the top substrate.

8. The microfluidic chip according to claim 1, wherein the microfluidic chip comprises a seal, which is configured to be toggled between:

an open state, in which the seal permits a flowing passage of fluid into the inner flow volume, and
a closed state, in which the seal prevents a flowing passage of fluid into the inner flow volume.

9. The microfluidic chip according to claim 1, wherein the body is flexible.

10. The microfluidic chip according to claim 1, wherein the chip is configured to facilitate an optical test.

11. The microfluidic chip according to claim 1, wherein the inner flow volume is configured to permit free air flow.

12. The microfluidic chip according to claim 1, wherein the waste reservoir or the sample reservoir or both is/are equipped with absorption material or a capillary pump.

13. The microfluidic chip according to claim 1, wherein the channels of the microfluidic chip are configured to provide a two-dimensional fluid flow.

14. The microfluidic chip according to claim 1, wherein the microfluidic chip is configured to facilitate an immunoassay or antibody test.

15. The microfluidic chip according to claim 1, wherein pneumatic source is configured to introduce pressurized air into the inner flow volume.

* * * * *